US006742152B2

(12) United States Patent
Terry

(10) Patent No.: US 6,742,152 B2
(45) Date of Patent: May 25, 2004

(54) PARALLEL SCAN TEST SOFTWARE

(75) Inventor: Steven W. Terry, Irving, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 479 days.

(21) Appl. No.: 09/834,023

(22) Filed: Apr. 11, 2001

(65) Prior Publication Data
US 2002/0152438 A1 Oct. 17, 2002

(51) Int. Cl.$^7$ .................................. G01R 31/28
(52) U.S. Cl. .................................. 714/729
(58) Field of Search .................. 714/726, 727, 714/729; 326/16

(56) References Cited

U.S. PATENT DOCUMENTS 4,602,210 A * 7/1986 Fasang et al. ............. 714/731
5,838,693 A * 11/1998 Morley ..................... 714/726

* cited by examiner

Primary Examiner—Albert Decady
Assistant Examiner—Shelly A Chase

(57) ABSTRACT

The present invention provides an improved boundary scan test system that can scan device scan paths in a parallel manner. In one embodiment, an improved method for processing a scan command from a pattern file is provided. The scan command is associated with (e.g., includes, points to) test device data that is to be scanned into physical system under test devices of a type specified by the command. Initially, a parallel device structure is acquired for the specified device type. The parallel device structure has one or more groups each identifying one or more parallel scan paths of devices within the physical system under test. A scan image is then prepared for each of the one or more groups whose one or more identified parallel scan paths include a device of the specified device type. For each group whose one or more scan paths has a device of the specified device type, a scan request, with the scan image prepared for the group, is then generated for that group. The scan request, when provided to a utility unit, causes the unit to scan in parallel the scan image into the one or more scan paths of the group in order to scan the test device data into the devices of the specified device type within the group.

18 Claims, 8 Drawing Sheets

PARALLEL SCAN TEST SOFTWARE

TECHNICAL FIELD

This invention generally relates to scanning data into and out of scan paths in a system comprising digital devices. In particular, the present invention relates to the parallel scanning and reading of data into and out of said scan paths.

BACKGROUND

Boundary scanning provides a way of reading and writing test data into and out of digital devices in a physical system such as a computer system in order to test the devices. In one scheme described by the IEEE 1149.1 specification, the devices each have test inputs and outputs for writing data into and reading data out of internal rings of test registers. The rings include both data and command rings for accessing the registers and controlling register configuration. Likewise, the test inputs and outputs include data, address, and control lines for accessing these rings. The registers may be dedicated test registers or part of the operable device circuitry. They are strategically located within the device so that known data strings can be written into the data rings, read back, and compared with expected values in order to test the state or operability of the device. When the test inputs and outputs from different devices within a system are connected to one another to form device chains, multiple devices within a system can be simultaneously tested by writing larger test data strings into and reading the resulting data out of the chained (or serially connected) devices.

FIG. 1 diagrammatically shows a prior art physical system under test ("PSUT") 100. System 100 generally includes N (one or more) device chains. Each device chain has one or more devices 120 "chained" to one another. In the depicted embodiment, the first chain includes devices $120A_1$, $120B_1$, through $120X_1$; the second chain includes devices $120A_2$, $120B_2$, through $120Y_2$; and the Nth chain includes devices $120A_N$, $120B_N$, through $120Z_N$. Each device chain has an input and an output port. The input port allows data to be scanned into a device chain, and the output port allows data to be read out of a chain. Within each chain, the devices are serially connected to one another through their test inputs and outputs. However, with some systems, the chains maybe selectively re-configured to form different device chains with different device combinations.

Each device 120 has one or more rings 125. Each ring consists of one or more test registers. Each ring provides a path for data to enter and exit the device. As data is entered at one end of the ring, data leaves at the other end of the ring. Only one ring in a device can be active at a time. In the depicted figure, dashed lines indicate inactive rings, while the solid lines indicate active rings. The chained together combination of active rings in a device chain constitutes a scan path within that chain. With N device chains, the depicted PSUT 100 includes N possible simultaneously active scan paths 1 through N.

Boundary scan test systems (not shown) are used to scan test data strings into a scan path and read them back therefrom. These test systems generally include both hardware and software components. Among other things, the hardware operably connects the test system to the PSUT for accessing devices. They also execute the software components and provide a physical interface to a user. The software components perform various functions including executing test pattern files in response to a request from a user. A test pattern file (or pattern file) includes both register data and commands for testing a device type or an entire device chain within a PSUT. In executing a pattern file, the software generates scan path images (strings) from the pattern file register data for each scan path (or in turn, device chain) that includes a device that is to be tested pursuant to a given pattern file. A scan path image corresponds to a string of data for an entire scan path. By writing a suitable scan path image into a scan path, the test system can write appropriate data (from a pattern file) into selected scan paths or selected devices within the scan path. The software also has the capability of reading back from the scan path a scan path image and extracting or identifying the portions corresponding to the devices of interest being tested.

Conventional systems generally use pattern files that include data strings for entire scan paths. This requires less capable test systems because they don't have to build a scan image, which requires knowledge of device locations within a given PSUT. Unfortunately, these less capable systems are limited in that they require separate pattern file sets matched to a particular PSUT. With complex systems such as high-end computer, medial and other systems, this can be costly since many system configuration combinations can exist due to many possible different device types (e.g., model, version) within a given system type. Other systems are capable of executing pattern files for device types rather than whole scan paths. Unfortunately, however, these systems build the scan path images and scan them into and/or out of the scan paths one scan path at a time. With complex systems having numerous devices, this can be highly inefficient.

SUMMARY OF THE INVENTION

The present invention provides an improved boundary scan test system that can scan device scan paths in a parallel manner. In one embodiment, an improved method for processing a scan command from a pattern file is provided. The scan command is associated with (e.g., includes, points to) device data that is to be scanned into physical system under test devices of a type specified by the command. Initially, a parallel device structure is acquired for the specified device type. The parallel device structure has one or more groups, each identifying one or more parallel scan paths of devices within the physical system under test. A scan image is then prepared for each of the one or more groups having one or more identified parallel scan paths with a device of the specified device type. For each group having one or more scan paths with a device of the specified device type, a scan request, with the scan image prepared for the group, is then generated for that group. The scan request, when provided to a utility unit, causes the unit to scan in parallel the scan image into the one or more scan paths of the group in order to scan the test device data into the devices of the specified device type within the group.

DETAILED DESCRIPTION

Figure 1:
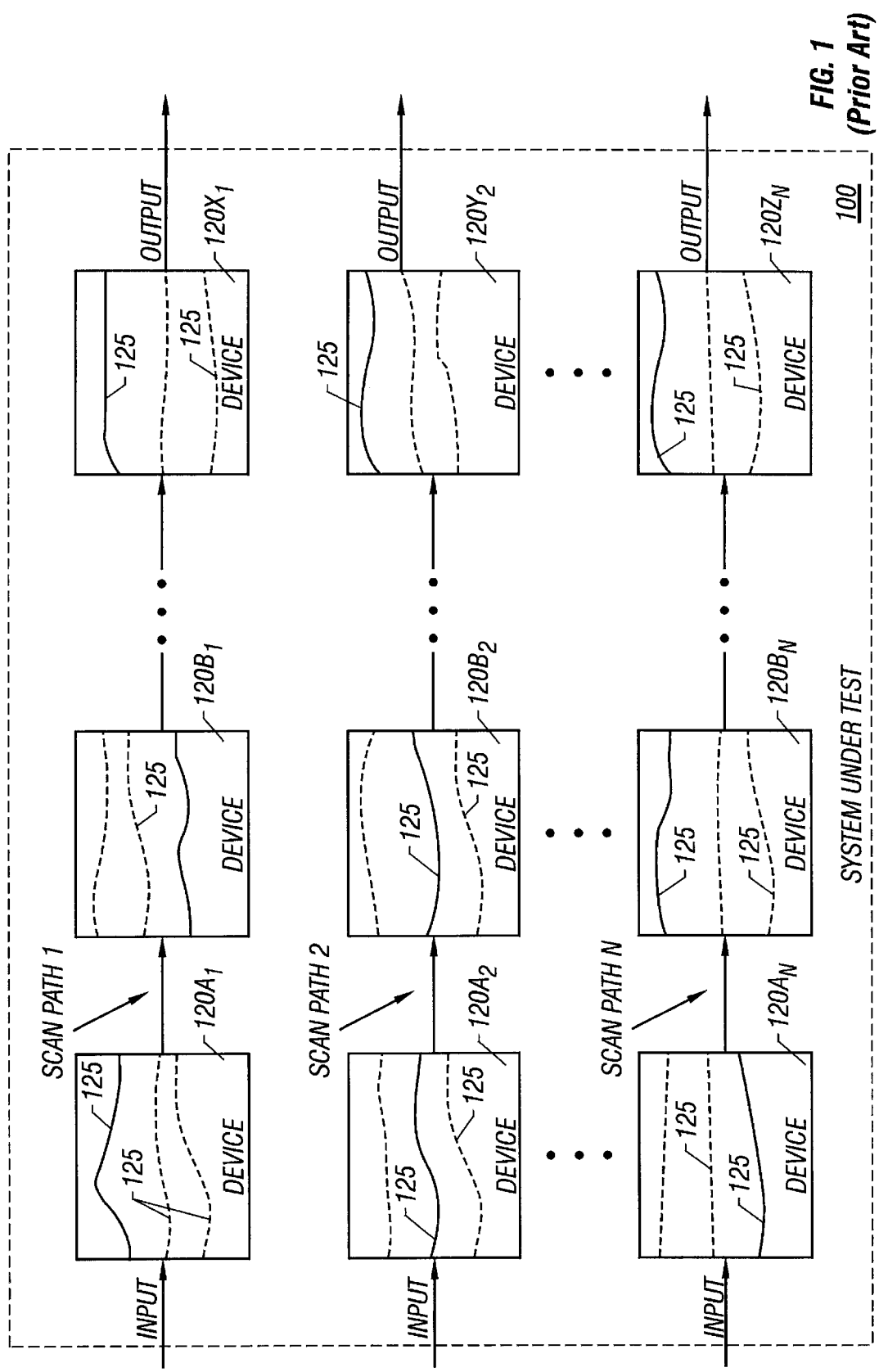
FIG. 1 (prior art) is a block diagram of a physical system under test.
Figure 2:
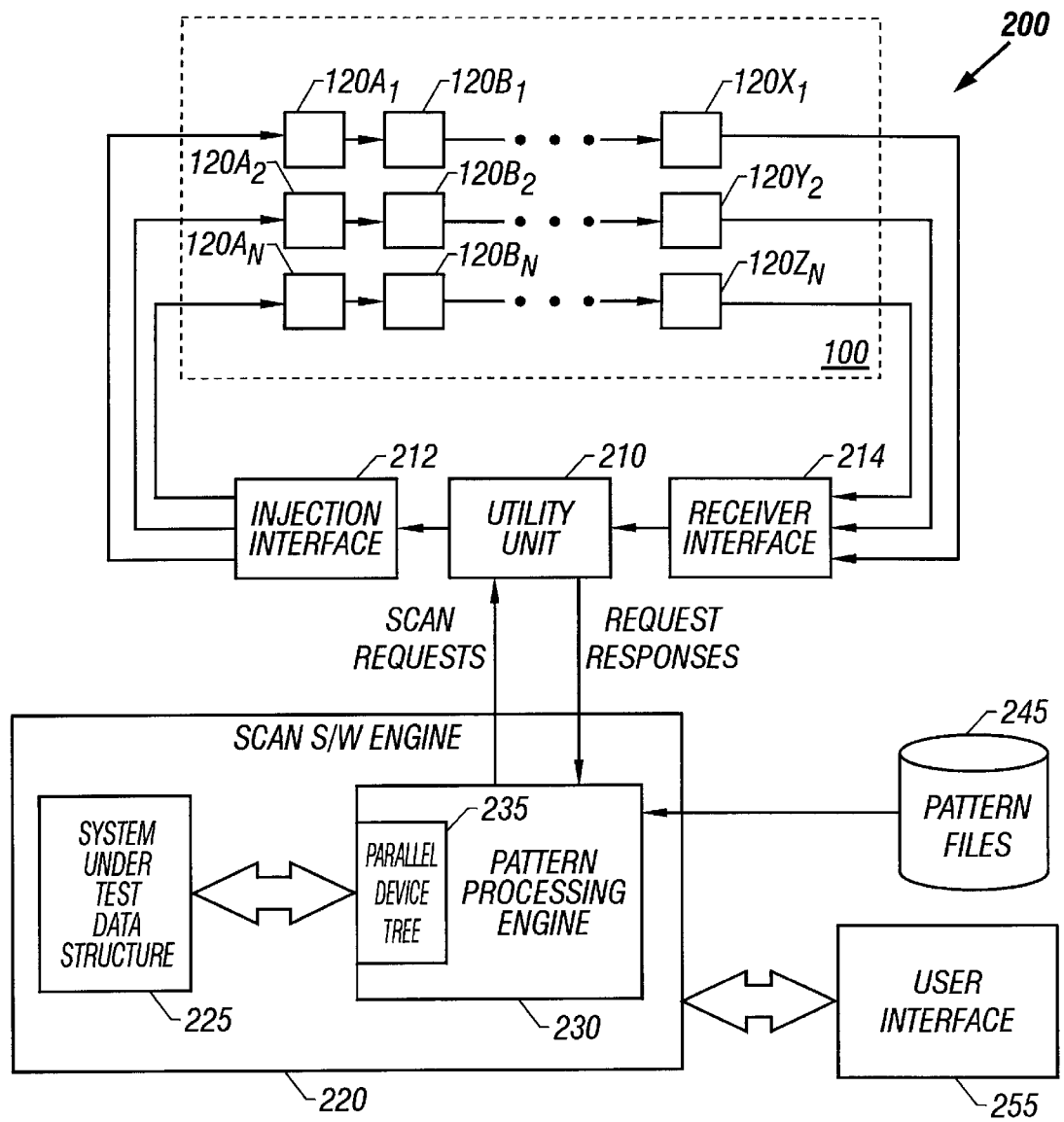
FIG. 2 is a block diagram of one embodiment of a test system of the present invention.

FIG. 2 shows one embodiment of boundary scan test system 200 of the present invention for testing physical system under test (PSUT) 100. Depicted test system 200 generally includes utility unit 210, injection interface 212, receiver interface 214, scan software engine 220, pattern file database 245 and user interface 255. Scan software engine 220 further includes system under test ("SUT") data structure 225, and pattern processing engine 230, which includes parallel device tree 235 of the present invention.

Utility unit 210 is connected to PSUT 100 input and output ports through injection and receiver interfaces, 212 and 214, respectively, in order to write and read scan path images (bit strings) into and out of selected) PSUT scan paths. A suitable interface (e.g., Ethernet interface) couples scan software engine 220 to utility unit 210 for transmitting scan requests and responses there between. Scan software engine 220 is also coupled to pattern file database 245 and to user interface 255. Among other things, it retrieves (and executes within pattern processing engine 230) pattern files from pattern file database 245 in response to receiving a device test request from a user via user interface 255.

Utility unit 210, along with injection and receiver interfaces, 212 and 214, comprise hardware for receiving and servicing scan requests from scan engine 220, and returning back to the scan engine corresponding scan request responses. In servicing a scan request, utility unit 210 writes (or injects) a scan image into one or more scan paths of the PSUT, as specified by scan software engine 220, through injection interface 212. As a scan path image is written into a scan path, data is normally simultaneously pushed into receiver interface 214 and captured by utility unit 214 as part of a scan path read operation. In servicing a scan request, utility unit 210 may write (or inject) a scan image into one or more scan paths of the PSUT or read from one or more scan paths, or do both at the same time as specified by scan software engine 220. Data written into the scan paths is driven by injection interface 212. Read operations involve scan data being pushed into receiver interface 214. In one embodiment, when a scan request for reading a scan path image into a single scan path is sent to the utility unit, the returned scan request response comprises the read back scan path data string. However, when parallel data path writes of a scan path image are requested for two or more parallel data paths, a boolean result indicating whether the parallel readback data strings are equal to one another is instead returned as the scan response to scan engine 220.

The injection and receiver interfaces generally include multiplexing circuitry for controllably and simultaneously (parallel) writing to and reading from one or more scan paths. Utility unit 210 generally includes a processor, memory with suitable firmware, and a scan controller operably connected to one another and to the injection and receiver interfaces for performing the utility unit scan functions mentioned above. For additional information relating to one particular system capable of implementing parallel boundary test scanning, reference is made to commonly owned U.S. patent application Ser. No. 09/549,233, now U.S. Pat. No. 6,618,827 entitled "SYSTEM AND METHOD FOR PARALLEL TESTING OF IEEE 1149.1 COMPLIANT INTEGRATED CIRCUITS," filed on Apr. 13, 2000, the reference of which is hereby incorporated herein by reference.

Scan software engine 220 generally performs several functions related to boundary scan operations. With particular relevance to the present invention, one of these functions includes enabling a user (e.g, person, computer) to execute pattern files for performing scan tests upon selected devices or device types within PSUT 100. In order to do this, in one embodiment, scan software engine 220 utilizes pattern processing engine 230 in cooperation with SUT data structure 225, as will be described in greater detail below. Scan (or JTAG) software engine 220 may be implemented with any suitable software for performing the boundary scan functions and routines described herein.

Scan software engine 220 generates (or has access to) SUT data structure 225 in order to model and organize actual PSUT 100. SUT data structure 225 may be implemented with any suitable data structure such as a database of hierarchal objects for modeling the devices and their physical connections within PSUT 100. SUT data structure 225 can perform various functions for scan software engine 220. With particular relevance to the present invention, one of these functions involves assisting pattern processing engine 230 to more effectively build scan path images from device-type pattern file data.

When pattern file data is to be scanned into PSUT devices of a given type, pattern processing engine 230 loads the data into SUT data structure objects that correspond to the physical devices that are to be so scanned. When desired objects within a scan path are appropriately loaded within the data structure, scan software engine 220, upon initiation from pattern processing engine 230, will then build a scan path image for that scan path from these loaded objects. This scan path image can then be sent to utility unit 210 and physically scanned into the scan path of PSUT 100. In this way, the pattern processing engine need not know anything about particular PSUT 100 being tested; instead, these details are dealt with by SUT data structure 225.

With relevance to the present invention, pattern processing engine 230 retrieves and executes pattern files from pattern file database 245 in order to test devices of PSUT 100. Pattern files include both data and commands that are executed by pattern processing engine 230. These commands include scan commands, which cause pattern data to be scanned into devices of a given type specified in a pattern file. Normally, data is also read back from the scanned devices and compared, e.g., with expected data from the pattern file in order to check the state or health of the devices. The parallel aspects of the present invention provide at least two improvements to pattern processing engine 230 for performing these operations. In one embodiment, parallel device tree 235 is generated and used by the pattern processing engine to allow it to perform both scan and read operations in parallel, which increases the efficiency of these operations. When data is to be scanned into devices of a given type, which may be located in numerous scan paths within PSUT 100, parallel device tree 235 causes pattern processing engine 230 to load in parallel the pattern file data into sufficiently equivalent (parallel) scan paths of SUT data structure 225. This causes (or allows) utility unit 210 to more efficiently scan the corresponding physical scan paths of PSUT 100 in parallel as well. In addition, parallel device tree 235 allows the pattern processing engine to perform read (or check) operations in parallel. When read-back data from parallel scan paths are to be checked against expected data, instead of reading back each image via a request response from utility engine 210 and comparing the data against the expected data, the pattern processing engine invokes the utility engine to perform a parallel compare operation on the parallel paths and returns back to pattern processing engine 230 a boolean response indicating whether the read back scan path images are equal to one another (and thus healthy). If the result indicates that the scan path images are the same, then much time is saved. If they are not equal, then pattern processing engine 230 performs the check test separately for each scan path. With most scan paths in a system being healthy, performing the check operations in this parallel manner substantially improves pattern file processing efficiency.

Figure 3:
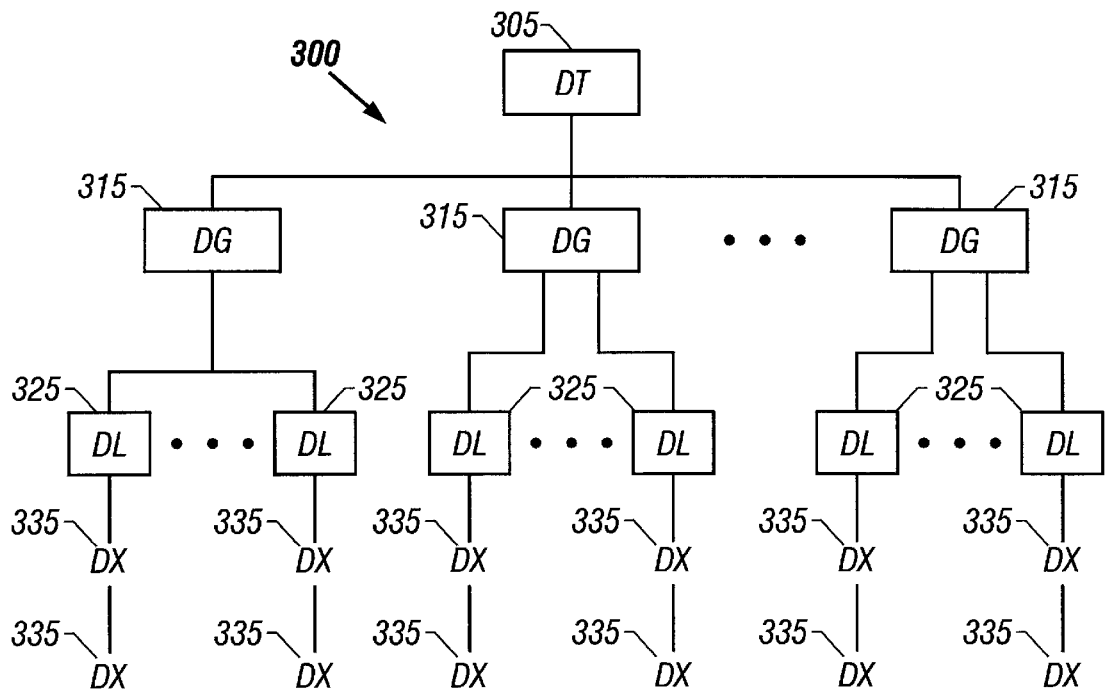
FIG. 3 shows one embodiment of a structure for implementing a parallel device tree of the present invention.

FIG. 3 shows one embodiment of general structure 300 for implementing parallel device ("PD") tree 235. Parallel device tree structure 300 generally includes device type block 305, one or more device group blocks 315, one or more device list blocks 325 within each device group, and one or more device blocks 335 within each device list.

Device type block, 305, identifies the type and version of the device that corresponds to the particular PD tree. Separate PD tree 235 is used for each device type within a system. The pattern processing engine may generate one or more PD trees 235 depending upon the number of separate device types being tested. Device group ("DG") data element 315 is used to group a collection of sufficiently equivalent (or parallel) scan paths that can be processed (scanned, read) in parallel. Each device list ("DL") 325 corresponds to a specific scan path within the system under test. Thus, each device group contains one or more device lists corresponding to scan paths that are parallel to one another. Each device list contains SUT data structure pointers 335 to device objects for devices of the DT device type that are within particular device list 325. There may be one or more device groups under the device type, DT, section. This DT, DG, DL layout is particularly effective for dealing with high reconfigurable systems. All the pattern processing engine needs to know is how to use the system under test data structure in a generic manner. The PD tree thus encapsulates the specific parallel structure of PSUT 100.

When executing a pattern file, the pattern processing engine will apply pattern file information (data and commands) to the system under test data structure. In doing this, it consults parallel device trees 235 to determine how it can scan the hardware in the most effective manner. This scheme allows the pattern processing engine to implement two types of parallelism at the same time. First, it can handle one or more of the same device types in the same scan path. Second, it can handle one or more of identical scan paths in a scan operation.

In one embodiment, pattern precessing engine 230 builds separate PD tree 235 for each device type, DT, that is to be tested (i.e., target device) for a given pattern file or pattern file command. In doing so, it "walks" through each device within the SUT data structure and determines if the device is a target device, and if it is a target device, finds or makes the proper device list, DL, in the proper device group, DG, under the proper parallel device type DT tree for the device. It then stores an identifier (address pointer) to the device in this proper DL. By the time all of the SUT data structure devices have been processed, a PD tree for each target device type will have been generated with all of the SUT devices for that device type properly stored in a suitable DL under a suitable DG. In one embodiment, a tree of linked lists is used as a data structure for implementing each PD tree 235. However, persons of ordinary skill will recognize that other suitable schemes could readily be used.

Figure 4A:
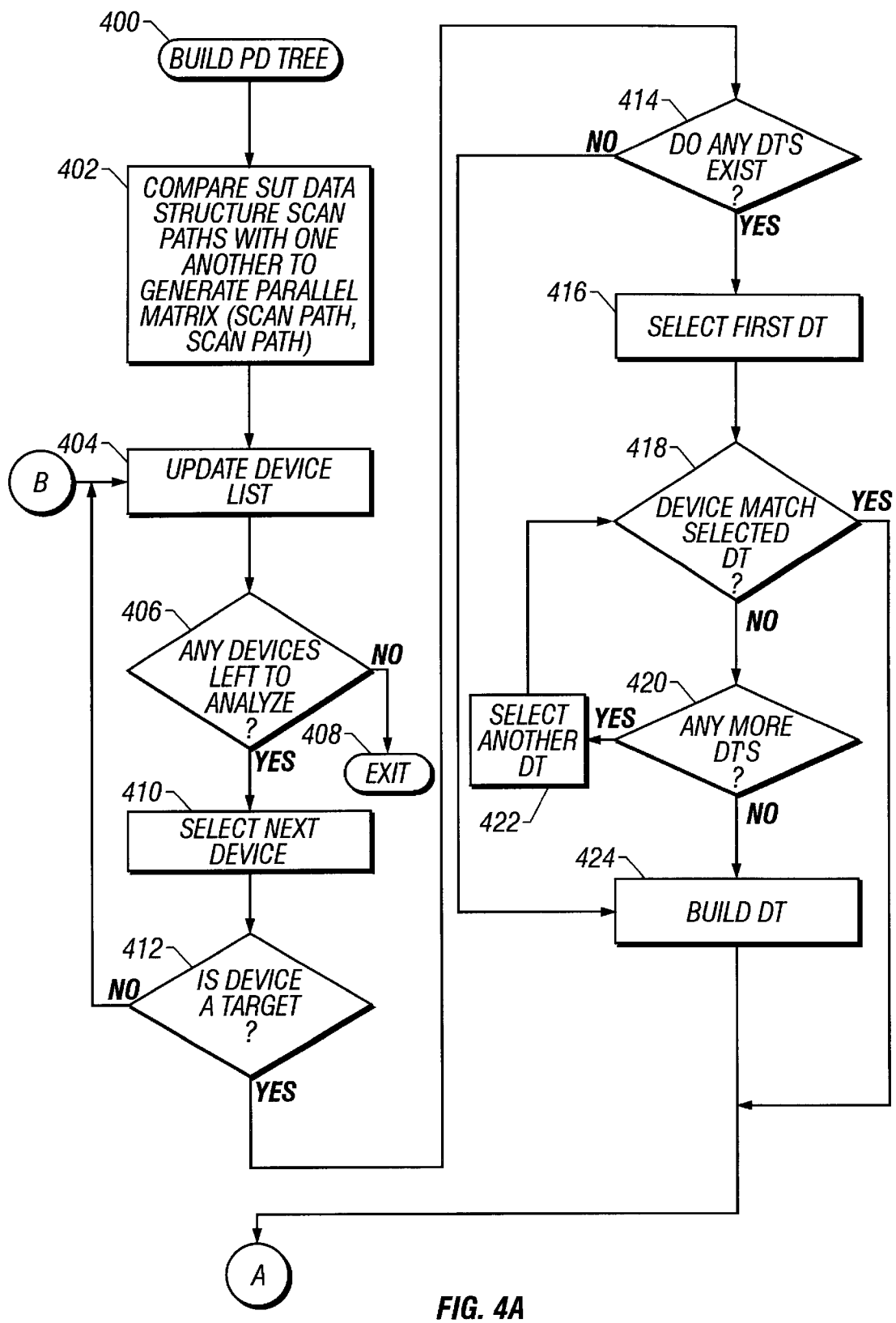
FIGS. 4A and 4B show one embodiment of a portion of a parallel device tree building routine of the present invention.
Figure 4B:
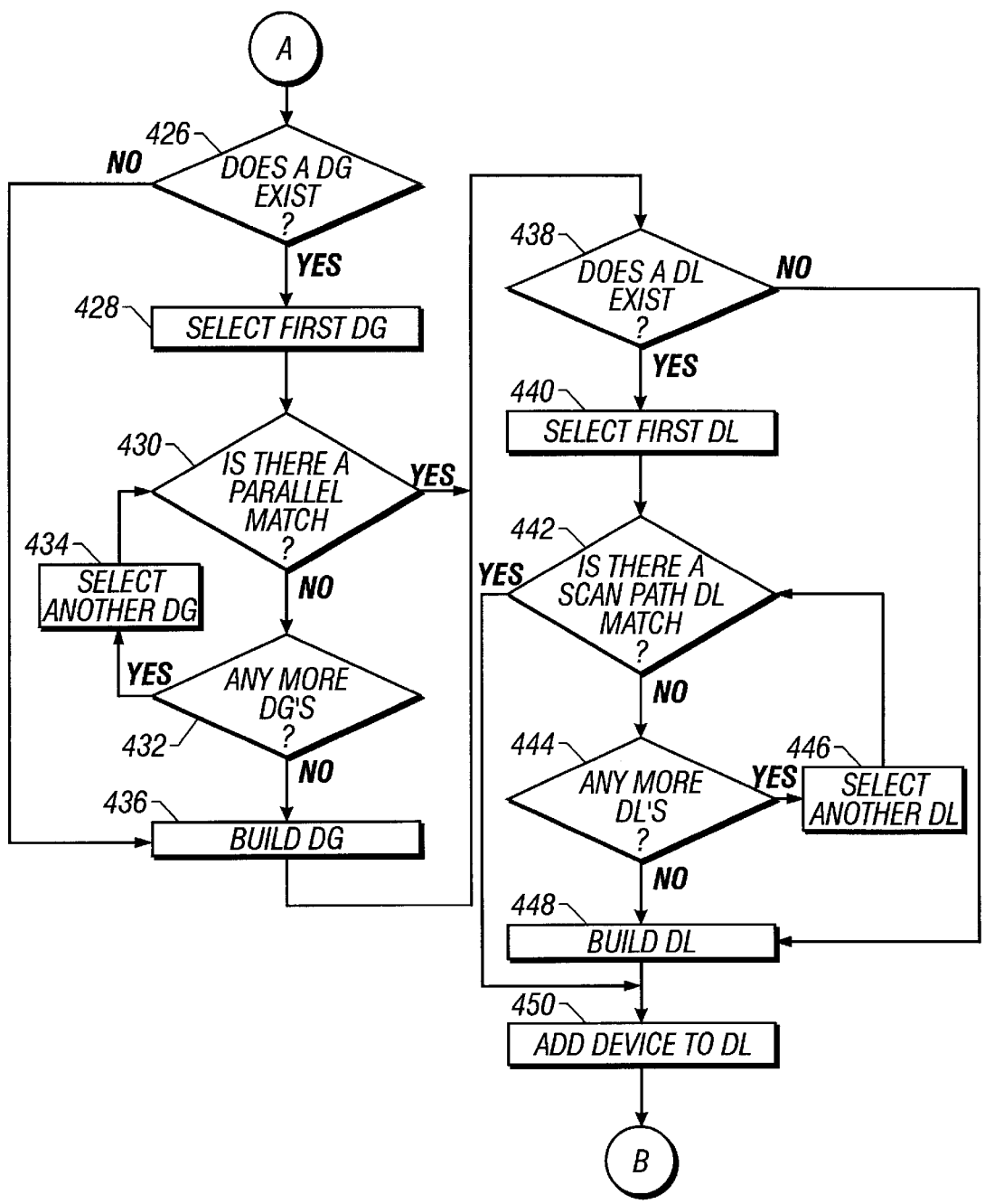

FIG. 4 shows one embodiment of portion 400 of a routine for building a parallel device tree 235 with structure 300. Initially, at step 402, the SUT scan paths are compared to identify the scan paths that are parallel with one another. A table, Parallel Matrix (scan path, scan path), is generated for storing the results of the comparisons. The Parallel Matrix is a look-up table for storing a boolean value for each scan path pair combination indicating whether or not the scan paths of the pair are parallel paths with respect to one another. Whether or not scan paths are sufficiently similar to be parallel with each other will depend on the parameters and characteristics of the particular test system in connection with the PSUT being tested. In some systems, scan paths may have to be identical in order to be parallel. That is, they may have to contain devices of the same type and revision level in the same relative positions. Other systems may be more tolerant, for example, requiring only that devices of the device type to be tested are located in the same relative locations. This will depend on what is required to inject the proper data into the relevant devices within a scan path because the same scan path image is used for parallel scan paths.

With the Parallel Matrix table having been created, the rest of routine 400 is directed to walking through SUT data structure 225 in order to identify devices of the selected device types and build the various trees for these devices. At step 404, a device list is consulted. This is a collection of the devices stored in the SUT data structure. Step 404 is also the start of the main loop for developing the PD tree. For the first pass, the device list will contain all devices in the SUT data structure. The processing loop will continue until all of the devices in this list have been examined to determine as to how they fit in the PD tree.

At decision step 406, the routine determines if there are any devices that have not yet been processed. If there are none, then the PD tree is complete and the function exits, at step 408. Otherwise, at step 410, another device from the SUT data structure is obtained. Decision point 412, asks if the selected device is a target. That is, is the device chosen from those in the SUT data structure one of the devices to be tested with the given pattern file?

Once a targeted device has been found, the routine proceeds to find its spot in the PD tree. The first question related to this effort is done at step 414, do any DT structures exist? The first time through the loop, the answer will be no. If that is the case, then the program will be directed to step 424 where an appropriate DT structure for the device will be built.

If there are DT's, the routine needs to look at each to find one that applies or find out if a new one should be created. To do this, the program selects the first one at step 416. At step 418, it checks to see if the DT is a match for the device. It is a match if the DT and the device represent the same device or part type. This is normally done by checking to see if both items use the same JTAG id. If a match is not found, the program continues to step 420. Step 420 is a decision point that checks to see if they are any more DT's to process. If not, the routine proceeds to step 424, where it builds a new DT. If there are more DT's to process, step 422 selects the next one to analyze. If a match with a current DT is found, then the routine will use that and not have to create a new one.

Once the proper DT is found or created, then the program needs to find or create a DG element. This process is much like what was done for DT's. At step 426, the program checks to see if any DG's exist. If not, the program leaps to step 436 and creates one. If DG's are present, then the program selects the first, step 428, and falls to a loop to look for a matching DG entry. Step 430 asks if the device is a parallel fit for the selected DG. A parallel fit is where the device lives on a scan path that is deemed to be parallel to the group of scan paths associated with the DG. This match is determined by examining the parallel matrix lookup table.

If there is not a match, step 432 is encountered. If there is another DG available for checking, step 434 is used to pick one, and the program returns to step 430. However, if the list of DG's has been exhausted, then the program goes to step 436 for the creation of a new DG. If step 430 does find a match, then no new DG is required and the building DG step is bypassed.

After the correct DG element is found or created, then the process must be repeated for the DL element that will go into the PD tree for the given device. Again, the process is the same as the DT and DG elements, except for the match criterion.

Step 438 checks for the existence of a DL for the current DG. If there is none, then step 448 will be used to create one. Otherwise, step 440 selects a DL. Step 442 is a decision point looking for a match. In this case, the program decides it has a match if the scan path for the device is the same as the scan path for the selected DL. If the match isn't found, step 444 will check for additional DL's to examine. Step 446 will select one from the remaining list and take the program back to step 442. If all DL's are examined and no match is found, then step 448 is used to create one. If step 442 does find a match, then the build DL step is avoided.

Once the DT, DG, and DL elements have been identified, then the device is added to the PD tree in step 450. This is a pointer or reference to the device structure in the SUT data structure. This pointer is directly tied to the DL element and is a bridge between the PD tree and SUT data structure.

Figure 5A:
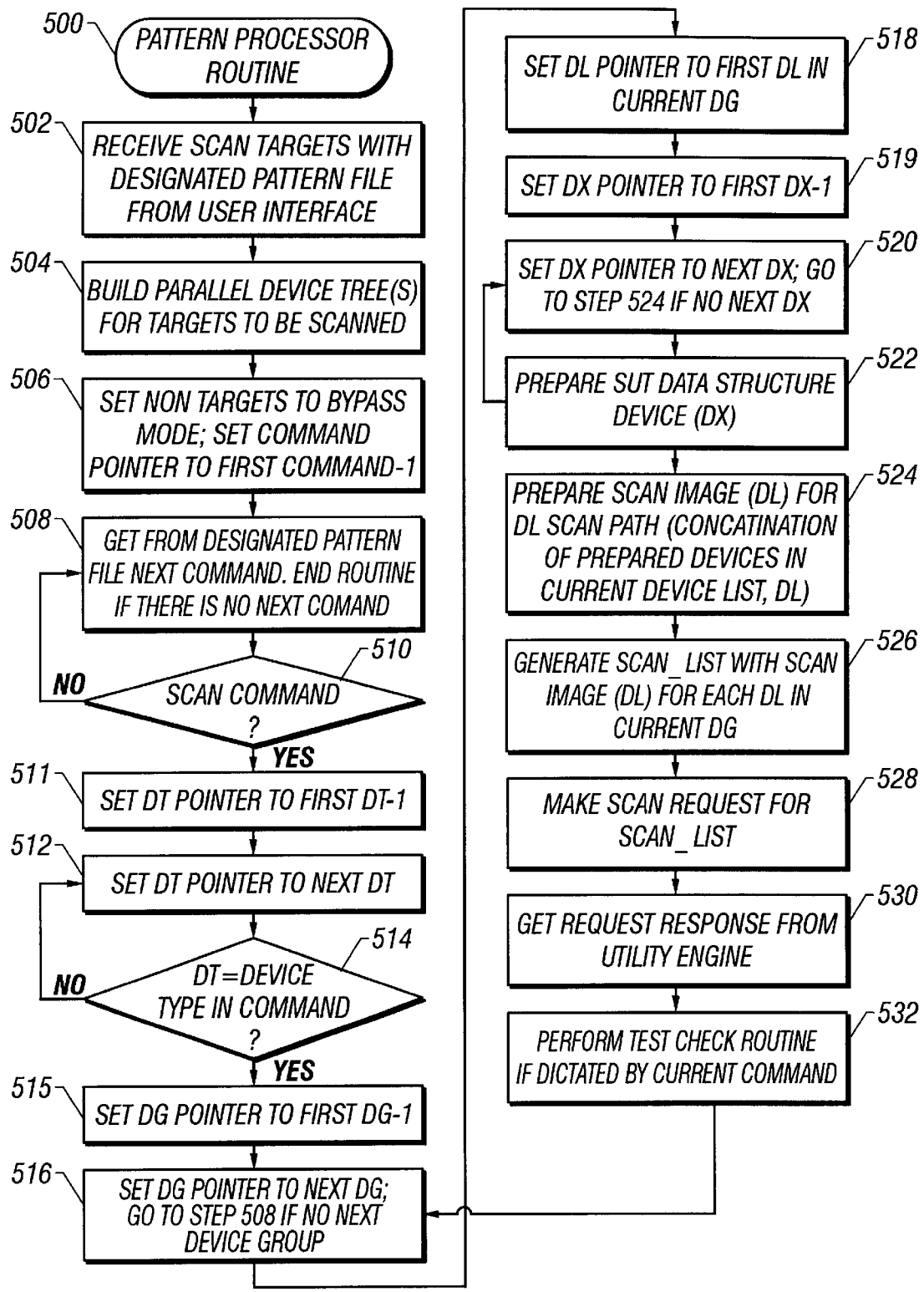
FIG. 5A shows one embodiment of a portion of a pattern processor routine of the present invention.

FIG. 5A shows one embodiment of a portion of pattern processing routine 500 for executing pattern file scan commands. Initially, in step 502, the pattern processor receives a designated pattern file with associated scan targets. A pattern file may be designated as part of a test request from user interface 245. At step 504, the routine next builds one or more parallel device trees (e.g., as previously described with reference to FIG. 4) for the received device targets to be scanned. At 506, the routine sets all non-targets to by-pass mode. It also sets the command pointer within the pattern file to the first command-1. This sets up the pattern processor for reading the first command within the current pattern file.

At step 508, the pattern processor routine gets the next command from the pattern file. It will get the first command if it is the first time through this loop. Conversely, it will end at this step if there is no next command within the pattern file (i.e., it has processed all of the commands). At determination step 510, the routine determines whether the retrieved command is a scan command. Pattern files may contain commands that provide run time control to the software; such commands do not require any scans of the hardware and are deemed non-scan commands. If it is a scan command, the routine proceeds to step 511. On the other hand, if the command is not a scan command, the routine returns back to step 508 to retrieve the next command within the pattern file.

If it proceeded to step 511, it then sets the PD tree DT pointer to the first DT-1. This sets up the routine for retrieving the DT of the first PD tree. The routine then proceeds to step 512 where it sets the DT pointer to the next DT. Thus, the first time through this loop, the routine would retrieve the first DT at this point.

At step 514, the routine determines whether the retrieved DT corresponds to a device type designated in the current scan command. If the DT does in fact match, the current device type in the command, then the correct parallel device tree has been identified at this point.

Next, at step 515, the routine would then set the DG pointer within this parallel device tree to the first DG-1. At step 516, the routine then sets the DG pointer to the next DG. It will go back to step 508 to get a next command if there is no next device group. Next, at step 518 the routine sets the DL pointer withing the current device group to the first DL within this current DG. At step 519, it sets the DX (or device) pointer within this device list to the first DX-1. At step 520, the routine sets the DX pointer to the next DX. It skips ahead to step 524 if (or when) there is no next DX. At 522, the routine prepares the SUT data structure device object that corresponds to the current device, DX, within the current device list, DL. It loops back to step 520 and repeats this process until all of the device objects within the current device list, DL, have been prepared.

At step 524, it prepares the entire SUT scan path for the current device list. This involves concatenating the previously prepared device objects into a scan image that corresponds to the scan path for the current device list, DL. At step 526, the routine generates a scan list with scan images, from the previous step, for each DL within the current device group. Step 524 generated the one scan image shared by the parallel paths. Step 526 made a list of those paths in parallel. Both pieces of information will be needed by utility unit 210 so it can drive the parallel scan operation. In this way, the processor only has to prepare one scan image for each of the scan paths (DLs) within each device group. It can repeatedly use this scan image for each device list scan path within the device group. At step 528, the routine then makes a scan request to utility unit 210 for the generated scan list. If the current DG has more than one DL, this results in the scan paths (corresponding to these DLs) being scanned in parallel.

Next at step 530, the request response is received from the utility engine. At step 532, the routine performs a test check routine if dictated by the current command. (One embodiment of a test check routine 532 will be addressed in greater detail below with reference to FIG. 5B) From here, the routine returns back to step 516 where it gets the next device group pointer within the current parallel device tree. At this point, the routine proceeds as previously described. The routine will continue by processing each of the remaining device groups within the current parallel device tree. In this way, all of the devices corresponding to the designated device type are scanned, and request responses will be received therefrom. By scanning from one group to the next, parallel scan paths within the system under test are more efficiently scanned in a parallel fashion.

One benefit from the use of this routine is that a small, focused database (PD tree) is used for collecting and organizing the scan data read in from the pattern file. Since the device pointers in the PD tree point back to the actual device objects in the SUT data structure, as scan data is processed through the PD tree, at the same time, scan operations for the SUT is also being set up. It may take some time to build the PD tree, but it is used over and over to process the scan data. This leads to a significant time savings since it lets the pattern processing engine quickly handle and exploit the parallel nature of the SUT.

Figure 5B:
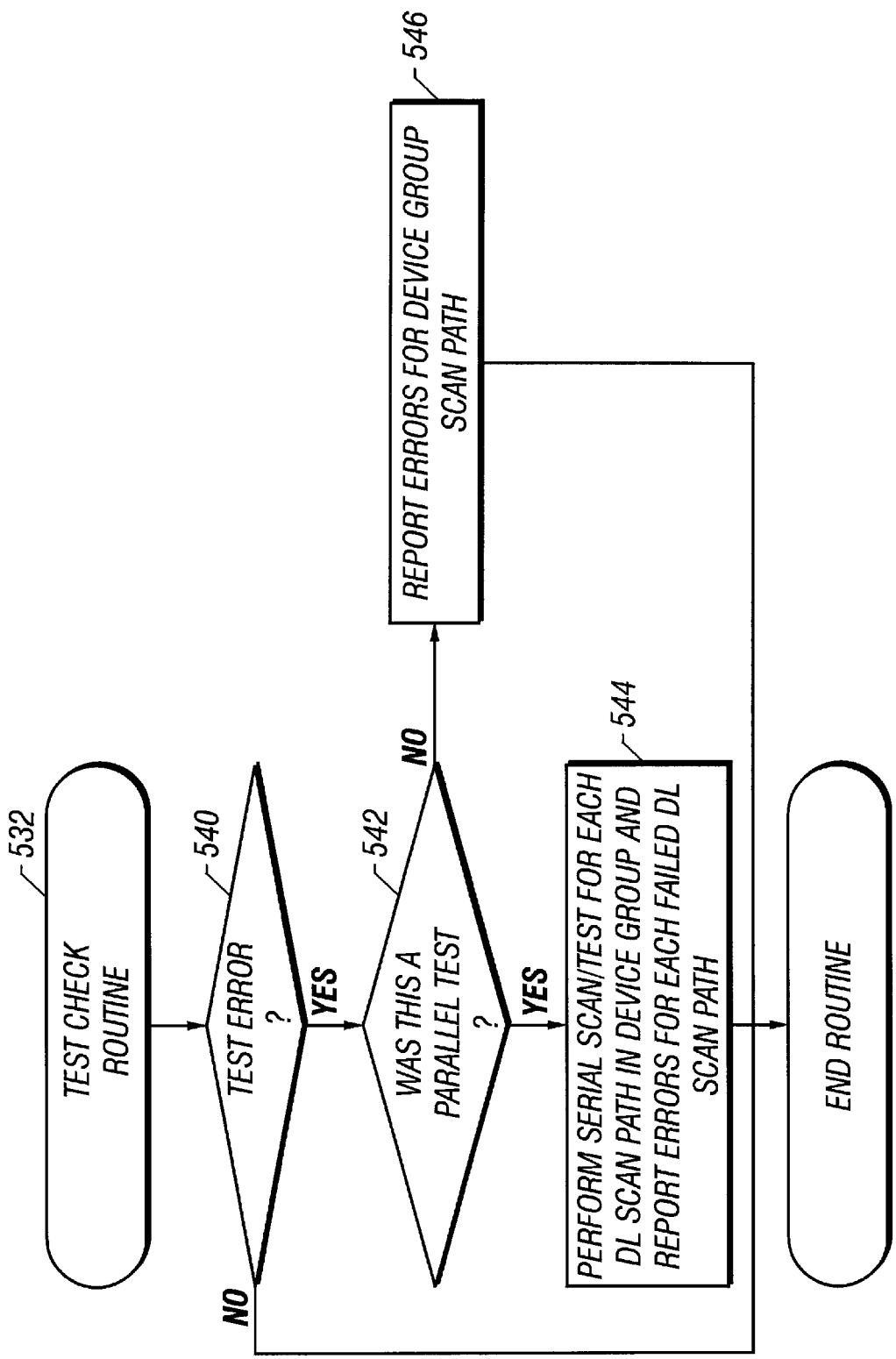
FIG. 5B shows one embodiment of a portion of a test check routine of the present invention.

FIG. 5B shows one embodiment of a test check routine portion 532. Initially, at step 540, it is determined whether a test error was generated. If no test error is indicated, the routine returns back to the pattern processing routine. On the other hand, if a test error did occur, then the test routine proceeds to step 542. At step 542, the routine determines whether the scan request was a parallel or serial scan request. If at 542, it is determined that the scan request was not a parallel scan request (i.e., it was for a single scan path), then at 546, an error report is generated for the scan path. On the other hand, at 542, if the scan request was for parallel scan paths, then at 544, the routine causes the scan paths to be re-scanned in a serial manner. An error report is then generated for the failed scan path(s) within this group.

With a serial scan request, utility unit 210 scans test data into appropriate devices within the designated scan path and receives from receiver interface 214 the resultant data. It then provides this data to pattern processing engine 230 in a scan response. The pattern processor then compares this read-back data against expected data. If the comparison indicates a failure on that scan path, then an error is generated. This provides the result for the test error determination step at 540.

On the other hand, with a parallel scan request, the utility unit scans, in a parallel fashion, the parallel scan paths and receives through it's receiver interface resultant data from each of these scan paths. It then (either within the utility unit or the receiver interface) compares these resultant data streams from the parallel scan paths to one another to determine if they are equal. If they are equal, a boolean scan request response indicating that no test error was observed is forwarded to pattern processing engine 230. This provides the result of the test error determination step at 540. On the other hand, if any of the resultant data streams are not equal to the others, then the utility engine sends through the request response a message indicating that an error occurred. With a parallel scan request, the parallel processor cannot determine which parallel scan path failed and which scan paths were error free; it can only determine that one or more of the scan paths within the device group failed. Thus, if it is determined that the device group is a parallel device group at step 542, then the routine proceeds to step 544 and initiates separate serial scan requests on each of the scan paths within the current device group. For faster operation during basic pass/fail testing, step 544 can optionally just print a message that an error occurred and not take the time to do the more detailed serial test steps.

Figure 6:
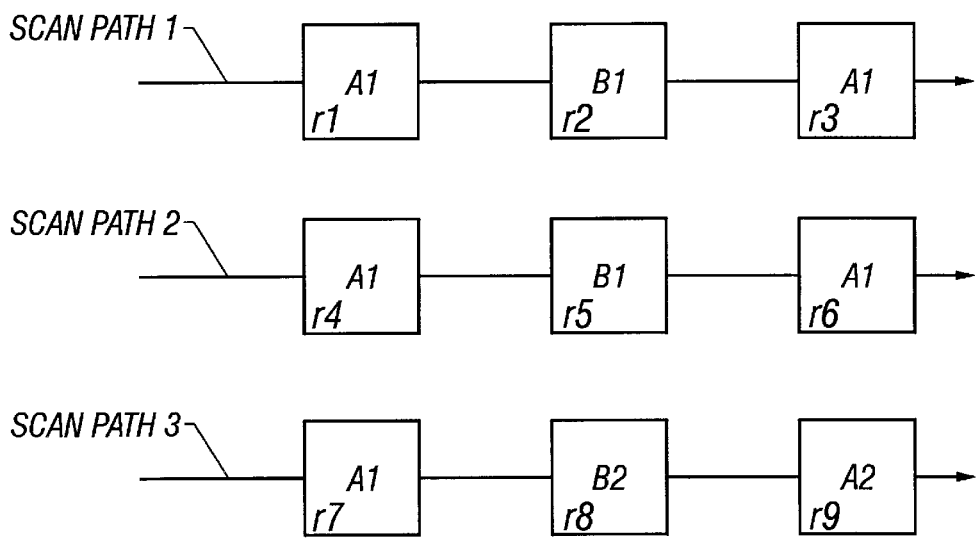
FIG. 6 shows an exemplary physical system under test.

With referenced FIGS. 6 and 7A–7D, a simple PD tree building example will now be presented. FIG. 6 represents a PSUT having three scan paths, each scan path having three devices. The first scan path includes devices R1, R2 and R3, the second path includes devices R4, R5, and R6; and the third scan path includes devices R7, R8, and R9. Overall, there are four types of devices and nine device instances within this exemplary system. The four device types are A1, A2, B1, B2. As can be seen in the FIGURE, the R1 device in the first scan path is an A1 device; the R2 device is a B1 device and the R3 device is an A1 device. Similarly, in the second path, the R4 device is an A1 device the R5 device is a B1 device; and R6 is an A1 device. Finally, with regard to the third path, the R7 device is an A1 device; the R8 device is a B2 device and the R9 device is an A2 device.

Since paths 1 and 2 have the same device types in the same locations, they are parallel paths. Path 3, however, is not parallel to either path 1 or path 2. Even though the same general types of devices (A, B) are in the same relative scan path positions, the versions in the second and third slots are different which prevents the third scan path from being parallel with the first two paths. Whether or not path 3 could be handled in a parallel fashion with paths 1 and 2 would depend on how much the scan pattern implementation in the newer devices differs from those from the older versions. For our case here, we will assume that the differences are significant enough so that path 3 cannot be treated as parallel with paths 1 and 2.

Figure 7A:
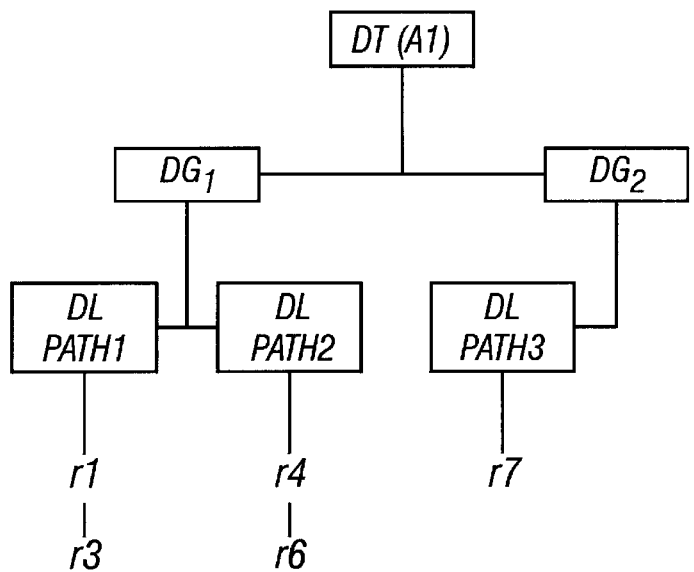
FIGS. 7A through 7D show generated parallel device trees for the exemplary PSUT of FIG. 6.

FIGS. 7A–7D depict the parallel device trees that would be generated for device A1, A2, B1 and B2, respectively, with routine 400. With reference to FIG. 7A, the PD tree for the A1 device type is shown. It can be seen that the first device group contains two device lists corresponding to the first and second parallel scan paths. The second device group contains a device list corresponding to the third path. The device lists contain device location identifiers for the device type associated with the device type tree—in this case, the A1 device type. Because the first and second paths include A1 devices and because they are parallel, they can be included in a common device group. In this case they are included in the first device group. Thus, the device lists for the first device group correspond to the first and second paths. The second device group contains a device list for the third path because it also includes one or more devices corresponding to the device type for the given device tree.

Figure 7B:
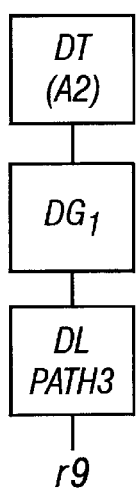

FIG. 7B shows the generated parallel device tree for the A2 device type. This depicted device tree has only one device group with only one device list, which corresponds to the third path. This is so, because the A2 device is only found within the third path for this exemplary system.

Figure 7C:
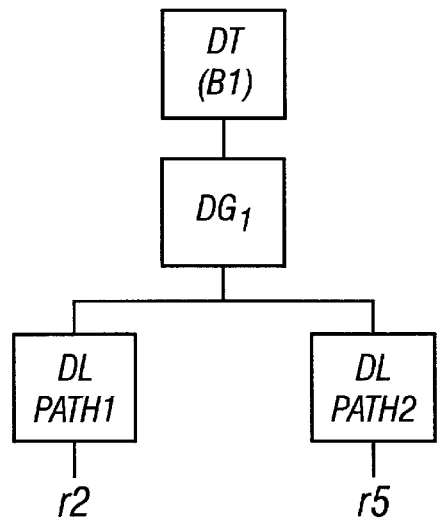

FIG. 7C shows the generated parallel device tree for the B1 device type. This device tree includes the location identifiers for all of the B1 devices within the system. Because the two instances of the B1 device are located in the first and second paths, this PD tree includes only one device group, which has device lists corresponding to the parallel first and second paths.

Figure 7D:
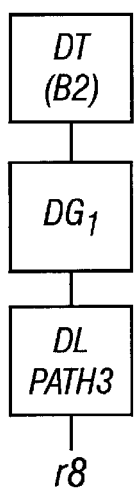

Finally, FIG. 7D shows the parallel device tree for the B2 device type. This device tree includes only one device group with only one device list corresponding to path 3, which includes the singular instance of the B2 device type.

The layout of the elements determines what is scanned in parallel and what is scanned in serial. Other software functions do not have to understand what is being scanned in parallel. Also, data and pattern files do not have to be altered to enable parallel scanning period since the PD tree structure is built at run time, it can be run on different targets without the user having to take any special actions to enable parallel scanning.

In the above example, the objective is to scan all of the devices within the system. If the user had selected a subset of devices, then the pattern processor would have only had to build parallel device trees for those selected targets. Devices not under test can be placed in the bypass state.

What is claimed is:

1. A test system for testing a target system, said target system having one or more scan paths with one or more devices, said test system comprising:

means for scanning a scan image into one or more scan paths of said target system having particular devices; said means capable of scanning the scan image into the one or more scan paths of said target device in a parallel manner;

means operably coupled to said scanning means for processing a pattern file having device test data for device types and for providing said scanning means with a scan image having the device test data particular to the devices of said target system, and wherein said pattern file processing means includes means for identifying the particular device type for each of said parallel scan paths; and means for enabling said scanning means to scan in parallel the provided scan image into one or more parallel scan paths of said target system that include devices of said particular device type in order to scan into said devices the device test data.

2. The system of claim 1 wherein said identifying means is implemented with a parallel device tree having a device type section for associating the parallel device tree with said particular device type.

3. The system of claim 2 wherein said parallel device tree further includes one or more device groups under the device type section, each device group having one or more device lists corresponding to parallel scan paths within target test systems.

4. The system of claim 2 wherein said device tree is implemented with at least one linked list data structure.

5. A test system for testing a target system, said target system having one or more scan paths with one or more devices, said test system comprising:

means for scanning a scan image into one or more scan paths of said target system having particular devices; said means capable of scanning the scan image into the one or more scan paths of said target device in a parallel manner, and wherein said scanning means is enabled by a scan request, and wherein each scan request enables a separate instance of said scan image for each of the plurality of parallel scan paths;

means operably coupled to said scanning means for processing a pattern file having device test data for device types and for providing said scanning means with a scan image having the device test data particular to the devices of said target system; and means for enabling said scanning means to scan in parallel the provided scan image into one or more parallel scan paths of said target system that include devices of said particular device type in order to scan into said devices the device test data.

6. A test system for testing a physical system under test ("PSUT"), said PSUT being adaptable to have one or more scan paths with one or more devices, comprising:

a utility unit adapted to be coupled to an input portion of the PSUT for scanning a scan image into a plurality of selected parallel scan paths in response to receiving a scan request that includes the scan image and identifies the selected parallel scan paths, and adapted to be coupled to an output portion of the PSUT for receiving output scan images from the plurality of selected scan paths, wherein the utility unit generates a scan response resulting from the scan request indicating whether the output scan images are equal to one another; and a pattern processing engine operably coupled to the utility unit for providing said unit with the scan request and receiving from it the resulting scan response, the pattern processing engine being capable of processing a pattern file with device test data to be scanned into devices of a specified device type, wherein the pattern processing engine provides to the utility unit a scan request with a scan image having the device test data for causing the utility unit to scan in parallel the scan image into selected parallel scan paths that include devices of the selected device type in order to scan the device test data into devices of the specified device type.

7. The system of claim 6 wherein the pattern processing engine includes a test check routine that deems the selected parallel scan paths as healthy if the scan response indicates their output scan images to be equal, and invokes a serial scan test for each of the selected parallel scan paths if the scan response indicates that they are not equal to one another.

8. A computer implemented method for processing a scan command with associated test device data to be scanned into a physical system under test devices of a specified device type, the method comprising:

acquiring a parallel device structure for the specified device type, the parallel device structure having one or more groups each identifying one or more parallel scan paths of devices within the physical system under test;

preparing a scan image for each of the one or more groups whose one or more identified parallel scan paths include a device of the specified device type; and for each group whose one or more scan paths have a device of the specified device type, generating a scan request with the scan image prepared for the group, wherein the scan request is capable of causing a utility unit to scan in parallel the scan image into the one or more scan paths of the group in order to scan the test device data into the devices of the specified device type.

9. The method of claim 8 wherein the parallel device structure is implemented with a parallel device tree having a device type section for associating the parallel device tree with the specified device type.

10. The method of claim 8 wherein the act of acquiring a parallel device structure includes generating the parallel device structure for the specified device type from a system under test data structure having a plurality of objects for modeling the scan paths and devices of the physical system under test.

11. The method of claim 10 wherein the act of generating the parallel device structure includes:

comparing each modeled scan path within the system under test data structure to identify scan paths that are parallel with one another; and storing in separate device groups one or more lists of device identifiers for devices of the specified device type, wherein each list corresponds to a scan path containing its device identifiers, and the one or more lists for each group correspond to scan paths that are parallel to one another.

12. The method of claim 11 wherein a tree of link lists data structure is used to implement the parallel device structure.

13. The method of claim 8 wherein the scan request includes a separate instance of the prepared scan image for each of the parallel scan paths within the group.

14. The method of claim 8 further comprising receiving a scan response for each scan request, wherein the scan response indicates whether data read back from the one or more parallel scan paths in each group are equivalent or not when the group includes two or more parallel scan paths, whereby the response indicates that the two or more parallel scan paths are healthy when their read back data are equal to each other.

15. The method of claim 14 wherein a serial scan request is initiated for each scan path within the group when the scan response indicates that the data read back from the two or more parallel scan paths are not equal to each other.

16. The method of claim 14 wherein the scan response includes the read back data when a group has only one scan path.

17. The method of claim 8 wherein the scan command is processed by a pattern processing engine processing a pattern file.

18. The method of claim 17 wherein the pattern processing engine is implemented within a scan software engine.

* * * * *